United States Patent
Sumakeris et al.

(10) Patent No.: US 6,896,738 B2
(45) Date of Patent: May 24, 2005

(54) INDUCTION HEATING DEVICES AND METHODS FOR CONTROLLABLY HEATING AN ARTICLE

(75) Inventors: Joseph John Sumakeris, Apex, NC (US); Michael James Paisley, Garner, NC (US)

(73) Assignee: Cree, Inc., Durham, NC (US)

( * ) Notice: Subject to any disclaimer, the term of this patent is extended or adjusted under 35 U.S.C. 154(b) by 224 days.

(21) Appl. No.: 10/017,492

(22) Filed: Oct. 30, 2001

(65) Prior Publication Data

US 2003/0079689 A1 May 1, 2003

(51) Int. Cl.⁷ .......................... H01L 21/00; C23C 16/00
(52) U.S. Cl. ...................... 118/725; 118/728; 219/634; 219/638; 156/345.52
(58) Field of Search ................................ 118/725, 728, 118/500; 219/634, 638

(56) References Cited

U.S. PATENT DOCUMENTS

| | | | |
|---|---|---|---|
| 3,424,628 A | 1/1969 | Winings | 148/175 |
| 4,722,911 A | 2/1988 | Frijlink | 437/110 |
| 4,748,135 A | 5/1988 | Frijlink | 437/102 |

(Continued)

FOREIGN PATENT DOCUMENTS

| | | | |
|---|---|---|---|
| EP | 0519608 | 12/1992 | C30B/25/12 |
| EP | 0956376 | 8/1997 | C23C/16/32 |

OTHER PUBLICATIONS

U.S. Appl. Ser. No. 09/756,548, filed Jan. 8, 2001.

Press Release, *Sterling Semiconductor Placed Order for Second EPIGRESS SiC CVD System*, Oct. 24, 2001, at http://www.compoundsemiconductor.net/PressReleases/2001/PR10240102.htm.

International Search Report for PC/US02/34090, dated May 19, 2003.

*Primary Examiner*—Gregory Mills
*Assistant Examiner*—Ram Kackar
(74) *Attorney, Agent, or Firm*—Myers Bigel Sibley & Sajovec

(57) ABSTRACT

A heating device for controllably heating an article defines a processing chamber to hold the article and includes a housing and an EMF generator. The housing includes a susceptor portion surrounding at least a portion of the processing chamber, and a conductor portion interposed between the susceptor portion and the processing chamber. The EMF generator is operable to induce eddy currents within the susceptor portion such that substantially no eddy currents are induced in the conductor portion. The conductor portion is operative to conduct heat from the susceptor portion to the processing chamber. The heating device may further include a platter and an opening defined in the conductor portion, wherein the opening is interposed between the susceptor portion and the platter.

29 Claims, 9 Drawing Sheets

U.S. PATENT DOCUMENTS

| | | | |
|---|---|---|---|
| 4,845,332 A | * 7/1989 | Jancosek et al. | 219/645 |
| 4,860,687 A | * 8/1989 | Frijlink | 118/500 |
| 4,961,399 A | 10/1990 | Frijlink | 118/730 |
| 4,976,217 A | 12/1990 | Frijlink | 118/733 |
| 5,027,746 A | 7/1991 | Frijlink | 118/724 |
| 5,056,555 A | 10/1991 | Frijlink | 137/522 |
| 5,108,540 A | 4/1992 | Frijlink | 156/612 |
| 5,119,540 A | 6/1992 | Kong et al. | 29/25.01 |
| 5,226,383 A | 7/1993 | Bhat | 18/730 |
| 5,468,299 A | 11/1995 | Tsai | 118/730 |
| 5,558,721 A | 9/1996 | Kohmura et al. | 118/730 |
| 5,674,320 A | * 10/1997 | Kordina et al. | 118/500 |
| 5,695,567 A | * 12/1997 | Kordina et al. | 118/725 |
| 5,704,985 A | 1/1998 | Kordina et al. | 118/725 |
| 5,759,263 A | 6/1998 | Nordell et al. | 117/98 |
| 5,788,777 A | 8/1998 | Burk, Jr. | 118/730 |
| 5,792,257 A | 8/1998 | Kordina et al. | 117/90 |
| 5,858,102 A | 1/1999 | Tsai | 118/719 |
| 5,879,462 A | 3/1999 | Kordina et al. | 118/725 |
| 6,005,226 A | 12/1999 | Aschner et al. | 219/390 |
| 6,030,661 A | 2/2000 | Kordina et al. | 427/248.1 |
| 6,039,812 A | 3/2000 | Ellison et al. | 118/725 |
| 6,048,398 A | 4/2000 | Vehanen et al. | 117/200 |
| 6,093,253 A | 7/2000 | Löfgren et al. | 118/725 |
| 6,217,662 B1 | * 4/2001 | Kong et al. | 118/725 |
| 6,239,418 B1 | 5/2001 | Konig et al. | 219/756 |
| 6,299,683 B1 | * 10/2001 | Rupp et al. | 117/88 |
| 6,331,212 B1 | * 12/2001 | Mezey, Sr. | 118/725 |
| 6,406,983 B1 | * 6/2002 | Holzlein et al. | 438/522 |
| 2001/0002948 A1 | 6/2001 | Aschner et al. | 392/418 |

* cited by examiner

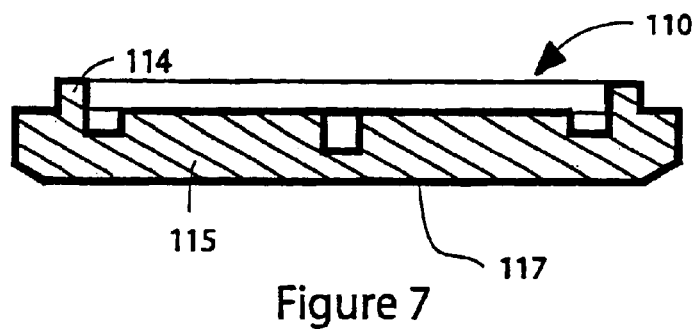
Figure 7
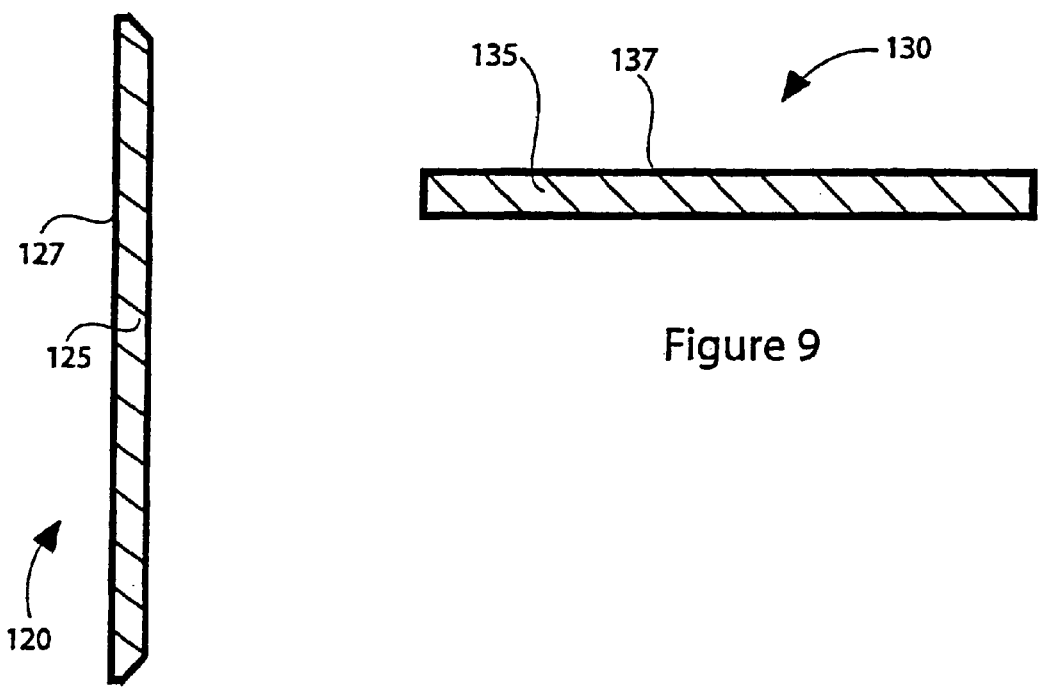
Figure 9
Figure 8

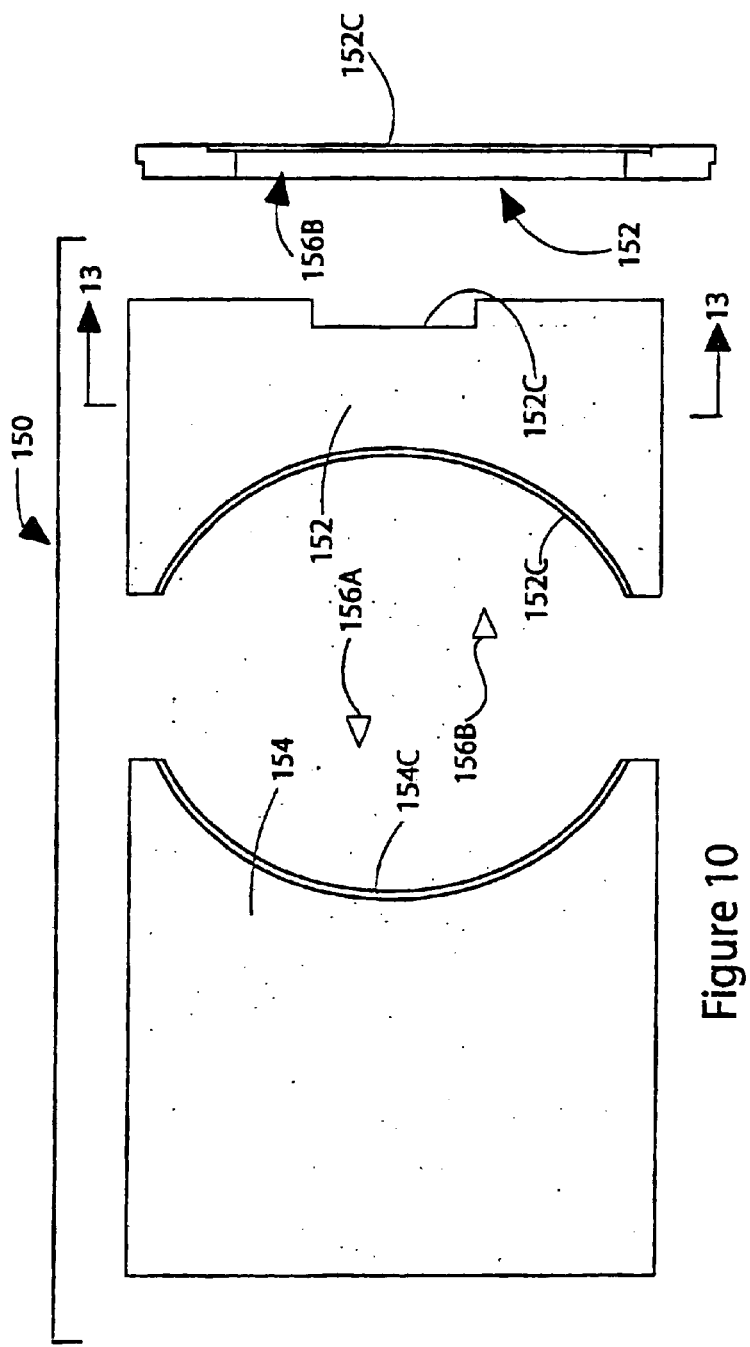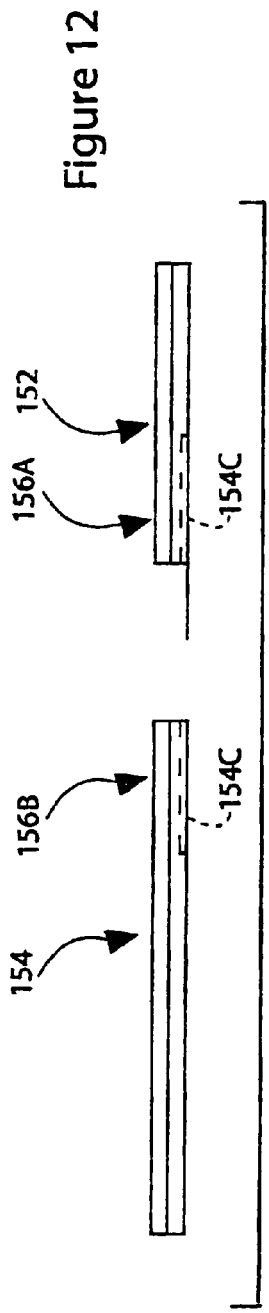
Figure 10
Figure 11
Figure 12

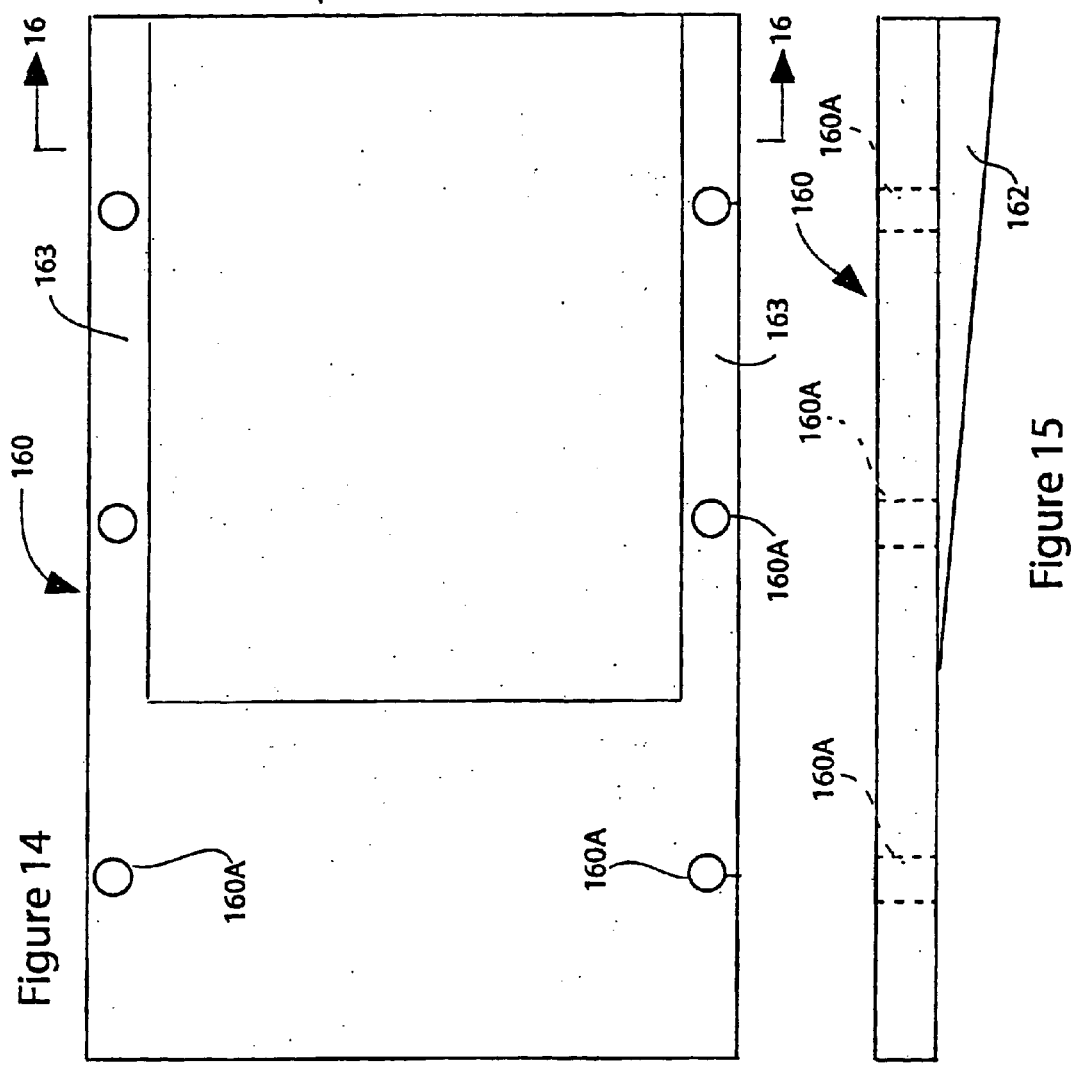

INDUCTION HEATING DEVICES AND METHODS FOR CONTROLLABLY HEATING AN ARTICLE

STATEMENT OF GOVERNMENT SUPPORT

The present invention was made, with Government support under Air Force Research Laboratory Contract No. F33615-00-C-5403 awarded by the United States Air Force. The Government has certain rights in this invention.

FIELD OF THE INVENTION

The present invention relates to methods and apparatus for controllably heating an article and, more particularly, to methods and apparatus for induction heating.

BACKGROUND OF THE INVENTION

Silicon carbide (SiC) is increasingly recognized as an effective semiconductor material for electronic devices. SiC possesses a number of properties that make it particularly attractive for applications requiring devices to operate at high temperature, power and/or frequency. SiC exhibits highly efficient heat transfer and is capable of withstanding high electric fields.

It has been demonstrated that hot-wall chemical vapor deposition (CVD) reactors can provide epitaxial layers of SiC with morphology and doping superior to cold-wall systems. See, for example, U.S. Pat. No. 5,695,567 to Kordina et al., the disclosure of which is hereby incorporated herein by reference. In certain processes, such as epitaxial growth processes, management of the thermal profile in the vicinity of the substrate may be of great importance. Temperature gradients may dramatically influence many growth parameters and the qualities of the resulting layers. Where the substrate is disposed on a platter (e.g., for rotation) separate from a surrounding susceptor and induction heating is employed, the platter may be significantly cooler than the internal surfaces of the susceptor. More particularly, the susceptor may be directly heated by an RF field while the platter is only or predominantly heated by thermal conduction and radiation from the susceptor. The substrate may be cooler even than the platter. As a result, a substantial thermal gradient may be manifested between the substrate growth surface and the internal surfaces of the susceptor. The thermal gradient may be further exacerbated by the cooling effect of a process gas flow through the susceptor.

The aforementioned temperature gradient may present a number of problems. Such problems may include the formation of loose deposits (e.g., SiC) on the hot susceptor wall. Such deposits may fall onto the substrate and be incorporated into the epilayers. Moreover, temperature gradients may cause difficulty in controlling material properties as a result of non-controllable variations in the temperature gradient and the narrowing of process windows.

The foregoing problems may also be presented in other types of processes such as other types of deposition processes and annealing processes.

SUMMARY OF THE INVENTION

According to embodiments of the present invention, a heating device for controllably heating an article defines a processing chamber to hold the article and includes a housing and an EMF generator. The housing includes a susceptor portion surrounding at least a portion of the processing chamber, and a conductor portion interposed between the susceptor portion and the processing chamber. The EMF generator is operable to induce eddy currents within the susceptor portion such that substantially no eddy currents are induced in the conductor portion. The conductor portion is operative to conduct heat from the susceptor portion to the processing chamber. The heating device may further include a platter and an opening defined in the conductor portion, wherein the opening is interposed between the susceptor portion and the platter.

According to embodiments of the present invention, a housing assembly for an induction heating device defines a processing chamber and includes a susceptor surrounding at least a portion of the processing chamber. A thermally conductive liner is interposed between the susceptor and the processing chamber. The liner is separately formed from the susceptor.

The susceptor may include a platter region and the housing assembly may further include: a platter adapted to support the article disposed in the processing chamber and overlying the platter region; and an opening defined in the liner and interposed between the platter region and the platter.

According to method embodiments of the present invention, a method for controllably heating an article includes positioning the article in a processing chamber. An electromagnetic field is applied to a housing about the processing chamber such that eddy currents are induced within an outer, susceptor portion of the housing and such that substantially no eddy currents are induced in an inner, conductor portion of the housing. Heat is conducted from the susceptor portion to the processing chamber through the conductor portion.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

FIG. 7 is a cross-sectional view of the bottom susceptor member of FIG. 5 taken along the line 7—7 of FIG. 5;

FIG. 8 is a cross-sectional view of a top susceptor member forming a part of the housing assembly of FIG. 1 taken along the line 8—8 of FIG. 1;

FIG. 9 is a cross-sectional view of a side susceptor member forming a part of the housing assembly of FIG. 1 taken along the line 9—9 of FIG. 1;

FIG. 10 is a bottom plan view of a bottom liner forming a part of the housing assembly of FIG. 1;

FIG. 11 is a side elevational view of the bottom liner of FIG. 10;

FIG. 12 is an end view of a rear liner member forming a part of the bottom liner of FIG. 10;

FIG. 14 is a bottom plan view of a top liner forming a part of the housing assembly of FIG. 1;

FIG. 15 is a side elevational view of the top liner of FIG. 14;

FIG. 16 is a cross-sectional view of the top liner of FIG. 14 taken along the line 16—16 of FIG. 14.

DETAILED DESCRIPTION OF THE PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
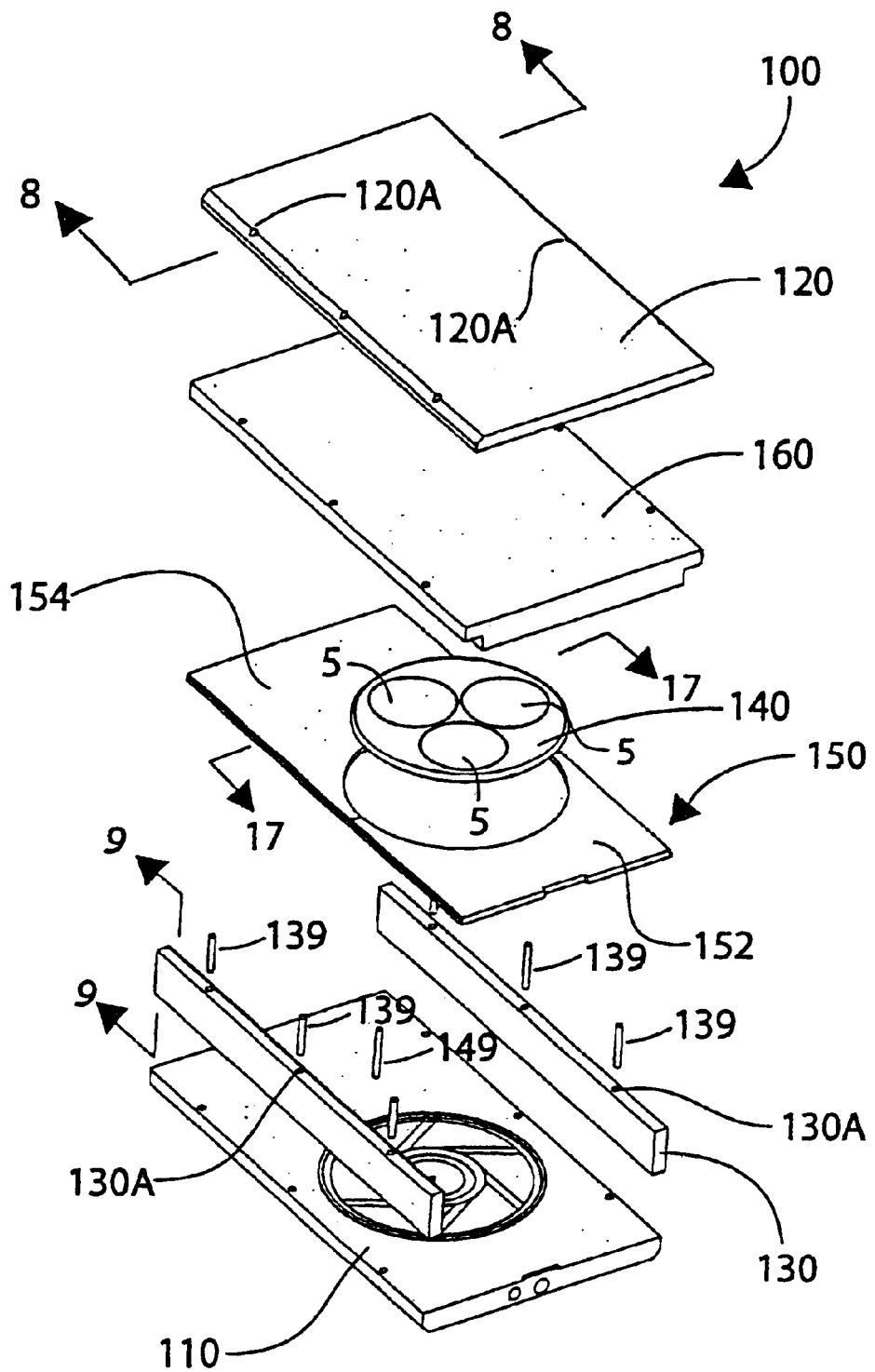
FIG. 1 is an exploded, perspective view of a housing assembly according to embodiments of the present invention.
Figure 2:
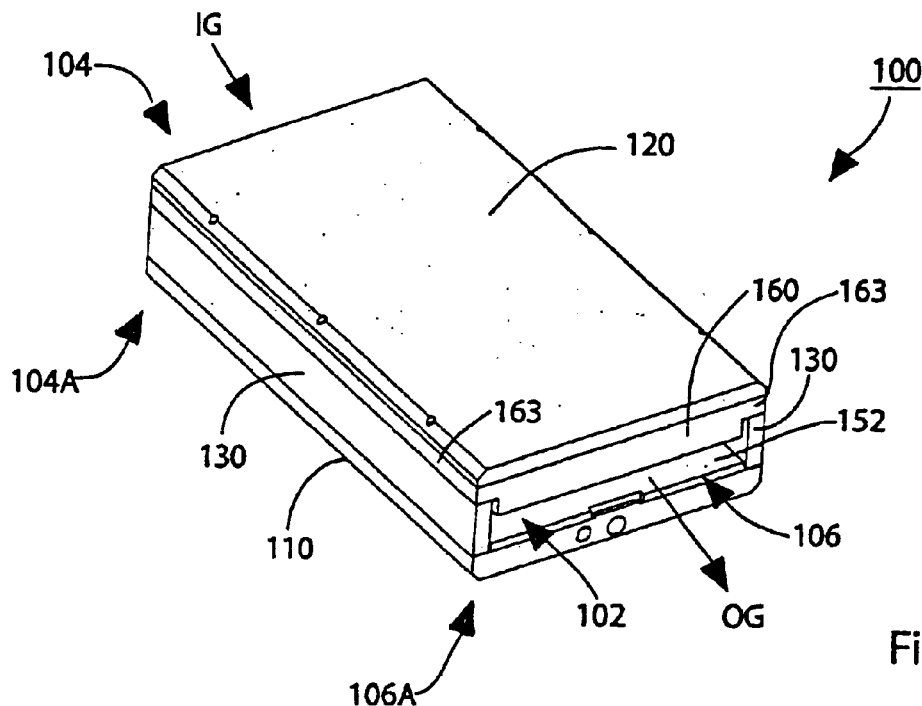
FIG. 2 is a perspective view of the housing assembly of FIG. 1.
Figure 3:
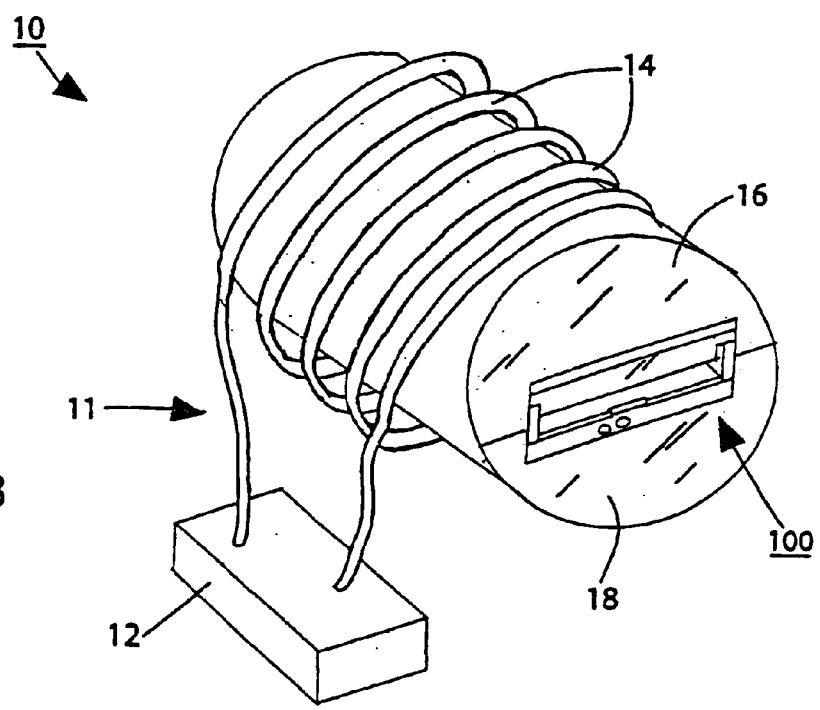
FIG. 3 is a perspective view of a reactor assembly according to embodiments of the present invention and including the housing assembly of FIG. 1.
Figure 4:
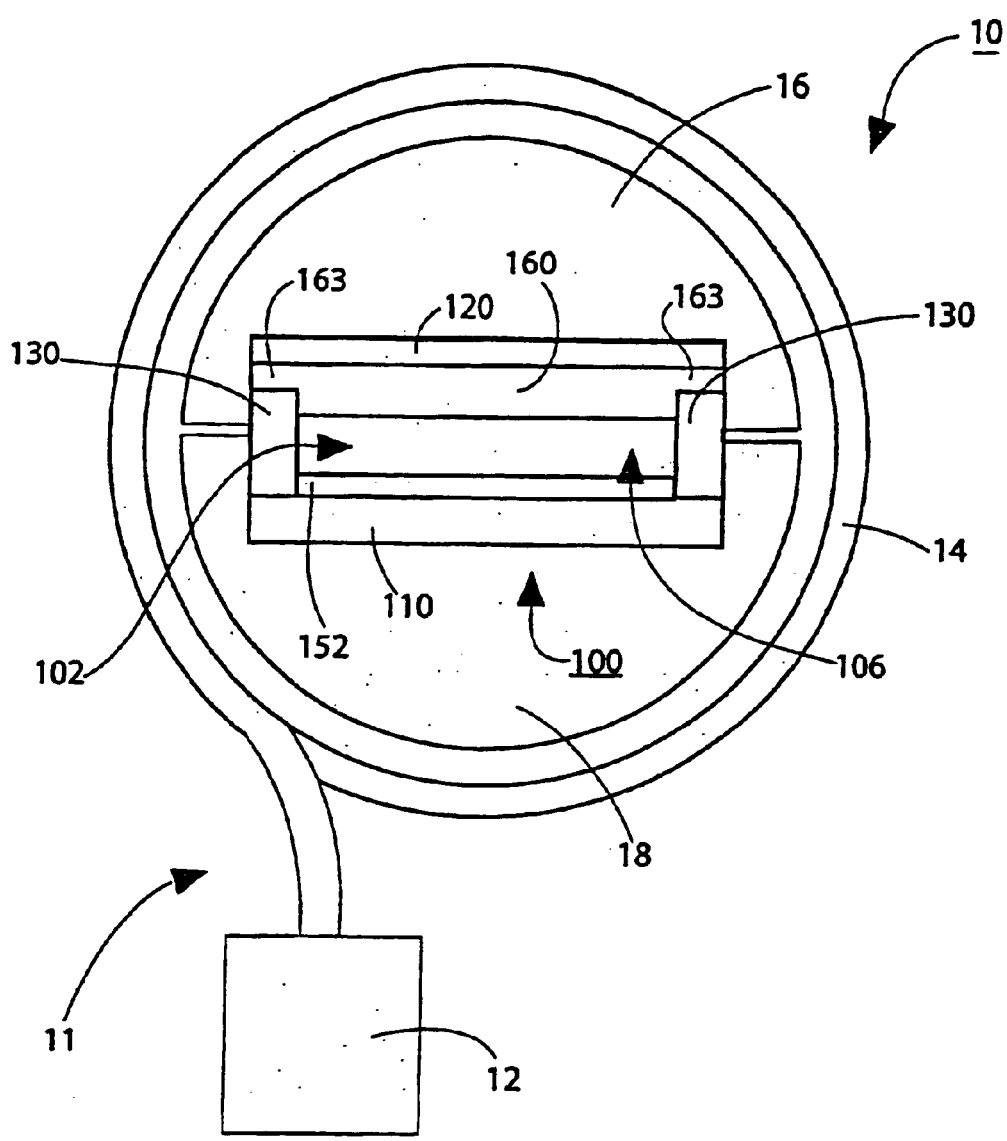
FIG. 4 is an end view of the reactor assembly of FIG. 3.

With reference to FIGS. 1–4, a housing assembly 100 and a heating device or reactor assembly 10 including the same according to embodiments of the present invention are shown therein. For the purposes of description, the housing assembly 100 has a front end 104A and a rear end 106A (FIG. 2). With reference to FIGS. 3 and 4, the reactor assembly 10 further includes insulation covers 16, 18 surrounding the housing assembly 100. An electromagnetic field (EMF) generator 11 is provided including an electrically conductive coil 14 surrounding the covers 16, 18 and a power supply 12 as discussed in greater detail below. The reactor assembly 10 serves as a portion of a hot-wall CVD reactor for processing substrates 5 (FIG. 1) such as semiconductor wafers using an atmosphere or flow of a processing gas IG (FIG. 2).

Turning to the housing assembly 100 in more detail, the housing assembly 100 includes a bottom susceptor member 110, a top susceptor member 120 and a pair of side susceptor members 130 joined by pins 139 and arranged to form a box that is open at opposed ends. A bottom conductor member or liner 150 is mounted on the bottom susceptor member 110. The bottom liner 150 includes a front liner member 154 and a rear liner member 152 which are separable from one another and together define an opening 156 therebetween. The opening 156 overlies and exposes a platter region 112 on the bottom susceptor member 110. A platter 140 overlies the platter region 112 and is received in the opening 156. The platter 140 is rotatably centered by a pivot pin 149. A top conductor or liner 160 overlies the platter 140. The top liner 160 is supported by flange portions 163 that are interposed between the top susceptor member 120 and the side susceptor members 130 on either side of the housing assembly 100.

With reference to FIG. 2, the housing assembly 100 defines a processing chamber or passage 102 extending fully through the housing assembly 100 and communicating with an inlet opening 104 and an outlet opening 106. More particularly, the passage 102 is defined by the interior surfaces of the bottom liner 150, the top liner 160, the side susceptor members 130 and the platter 140.

Figure 5:
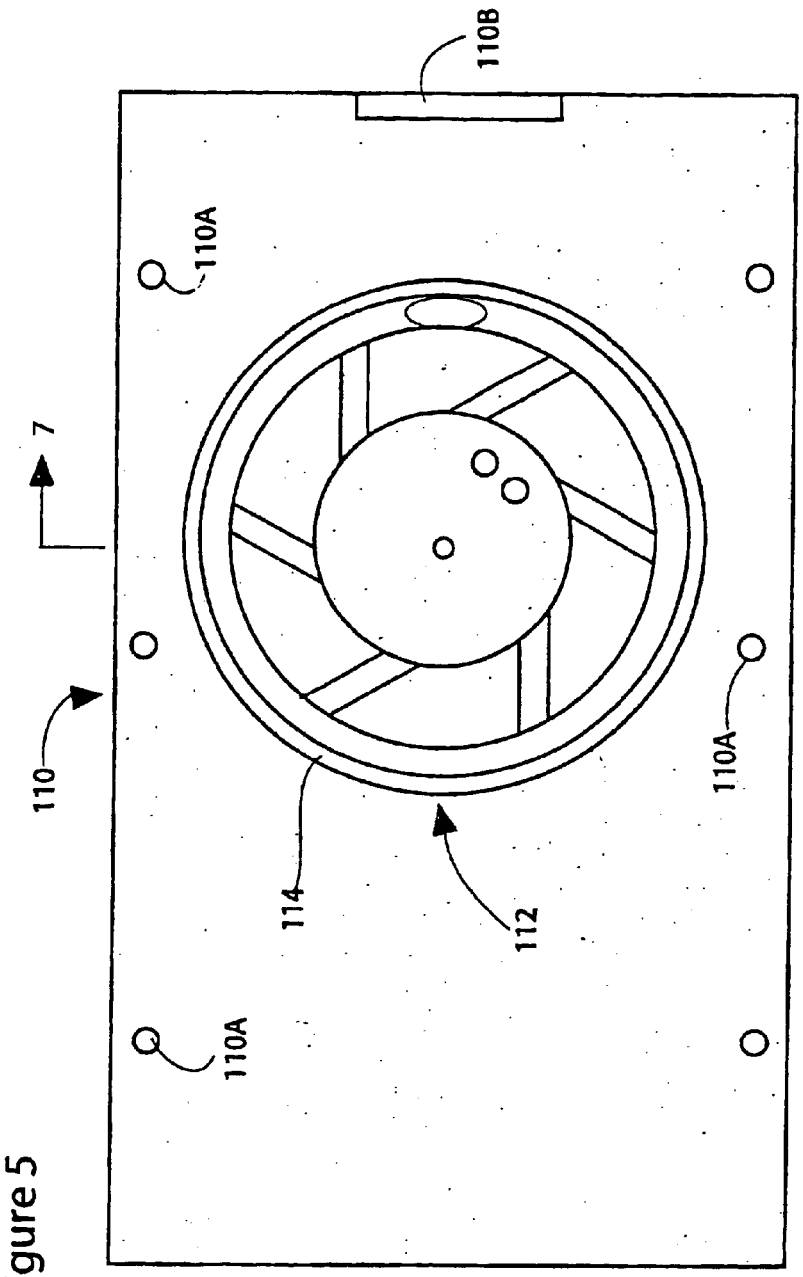
FIG. 5 is a top plan view of a bottom susceptor member forming a part of the housing assembly of FIG. 1.
Figure 6:
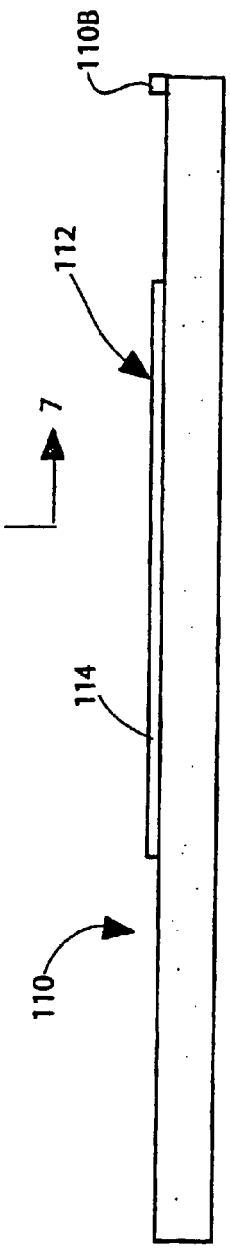
FIG. 6 is a side elevational view of the bottom susceptor member of FIG. 5.

Referring to FIGS. 5 and 6, the bottom susceptor member 110 includes holes 110A to receive the pins 139 or other fasteners. The platter region 112 may be adapted to provide gas driven rotation of the platter 140, for example, as disclosed in U.S. patent application Ser. No. 09/756,548, titled Gas-Driven Rotation Apparatus and Method for Forming Silicon Carbide Layers, filed Jan. 8, 2001, inventors Paisley et al., the disclosure of which is hereby incorporated herein in its entirety. An annular, upstanding ridge 114 surrounds the platter region 112. An upstanding tab 110B is disposed adjacent the rear end of the bottom susceptor member 110.

With reference to FIG. 7, the bottom susceptor member 110 includes a core 115 and a surrounding layer or coating 117. Preferably, the coating 117 completely surrounds the core 115. The core 115 is formed of a material that has high purity, is able to withstand high temperatures (e.g., having a melting point greater than 1800° C.), has low chemical reactivity, and has acceptably low electrical resistance. Preferably, the material of the core 115 has an electrical resistivity of no more than about $100 \times 10^{-6}$ ohm-meter. Preferably, the core 115 is formed of graphite (preferably high purity graphite).

The coating 117 is formed of a material that has high purity, is able to withstand high temperatures (ea. having a melting point greater than 1800° C., has low chemical reactivity, and has acceptably low electrical resistance). Preferably, the material of the coating 117 has a resistivity that is less than the resistivity of the core 115. More preferably, the material of the coating 117 has a resistivity that is no more than 20% of the resistivity of the core 115. Preferably, the material of the coating 117 has a resistivity of no more than about $20 \times 10^{-6}$ ohm-meters.

Preferably, the coating 117 is formed of SiC or a refractory metal carbide, more preferably TaC, NbC, and/or TiC. Most preferably, the coating 117 is formed of tantalum carbide (TaC). The coating 117 may be applied to the core 115 by any suitable method. Preferably, the coating 117 is a dense, impervious coating. Preferably, the coating 117 has a thickness of at least about 10 microns.

With reference to FIGS. 1 and 8, the top susceptor member 120 includes holes 120A to receive the pins 139 or other fasteners. With reference to FIG. 8, the top susceptor member 120 includes a core 125 and a surrounding layer or coating 127. Preferably, the coating 127 completely surrounds the core 125. The core 125 may be formed of the same materials as discussed above with regard to the core 115, with the same material(s) being preferred. The coating 127 may be formed of the same materials and in the same dimensions as discussed above with regard to the coating 117, with the same material(s) and dimensions being preferred, and may be applied to the core 125 in the manner described above.

With reference to FIGS. 1 and 9, each side susceptor member 130 includes holes 130A to receive the pins 139 or other fasteners. With reference to FIG. 9, the side susceptor member 130 includes a core 135 and a surrounding layer or coating 137. Preferably, the coating 137 completely surrounds the core 135. The core 135 may be formed of the same materials as discussed above with regard to the core 115, with the same material(s) being preferred. The coating 137 is preferably formed of an impervious material. More preferably, the coating 137 is formed of SiC (preferably dense SiC that is impervious and has a 0% porosity). The coating 137 may be applied to the core 135 by any suitable means or methods. Preferably the coating 137 has a thickness of at least 100 microns.

With reference to FIGS. 10–13, the bottom liner 150 is shown therein with the liner members 152 and 154 separated for clarity. The rear liner member 152 includes an end slot 152B adapted to receive the tab 110B of the bottom susceptor member 110. The rear liner member 152 and the front liner member 154 define opposed semicircular recesses 156B and 156A, respectively. Additionally, semicircular, downward facing recesses 152C and 154C are formed in the liner members 152 and 154 along the recesses 156A and 156B.

Figure 13:
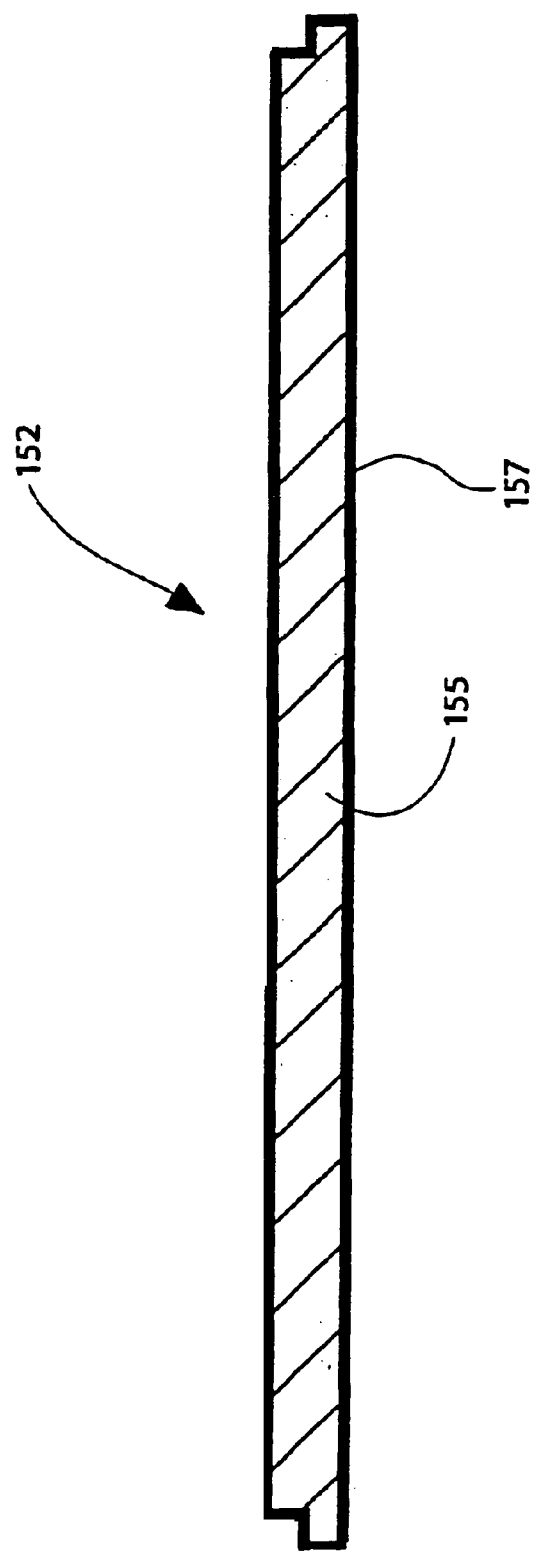
FIG. 13 is a cross-sectional view of the bottom liner of FIG. 14 taken along the line 13—13 of FIG. 10.

With reference to FIG. 13, the rear liner member 152 includes a core 155 and a surrounding layer or coating 157. Preferably, the coating 157 completely surrounds the core 155. The core 155 is formed of a material that has high purity, is able to withstand high temperatures (e.g., having a melting point greater than 1800° C., has low chemical reactivity, and has acceptably low electrical resistance). Preferably, the core 155 is formed of graphite. The core 155 may be formed in the same manner as described above for the core 115. Preferably, the core 155 has a thickness of at least 0.15 inch. The core is preferably adapted to provide a substantially coplanar upper surface with the platter 140 when in use (i.e., the platter 140 is levitated).

The coating 157 is formed of a material that has low chemical reactivity. Preferably, the coating 157 is formed of SiC or a refractory metal carbide that is compatible with SiC. More preferably, the coating 157 is formed of SiC (preferably dense SiC that is impervious and has a 0% porosity). The coating 157 may be applied to the core 155 by any suitable means or methods. Preferably, the coating 157 has a thickness of at least about 10 microns. The front liner member 154 is constructed in the same manner as the rear liner member 152, and has a core (not shown) corresponding to the core 155 and a coating corresponding to the coating 157.

With reference to FIGS. 14–16, the top liner 160 includes holes 160A adapted to receive the pins 139 or other fasteners. A wedge portion 162 of the top liner 160 extends with increasing thickness in the direction of the rear end of the top liner 160. The wedge portion 162 may serve to gradually decrease the boundary layer of processing gas flowing through the passage and the outlet opening 106 to promote transfer of reactants to the substrate surface from the processing gas.

Referring to FIG. 16, the top liner 160 includes a core 165 and a surrounding layer or coating 167. Preferably, the coating 167 completely surrounds the core 165. The core 165 may be formed of the same materials as discussed above with regard to the core 155. The coating 167 may be formed of the same materials as discussed above with regard to the coating 157 and may be applied to the core 165 in the manner described above. Preferably, the core 155 has a nominal thickness of at least about 0.15 inch.

Figure 17:
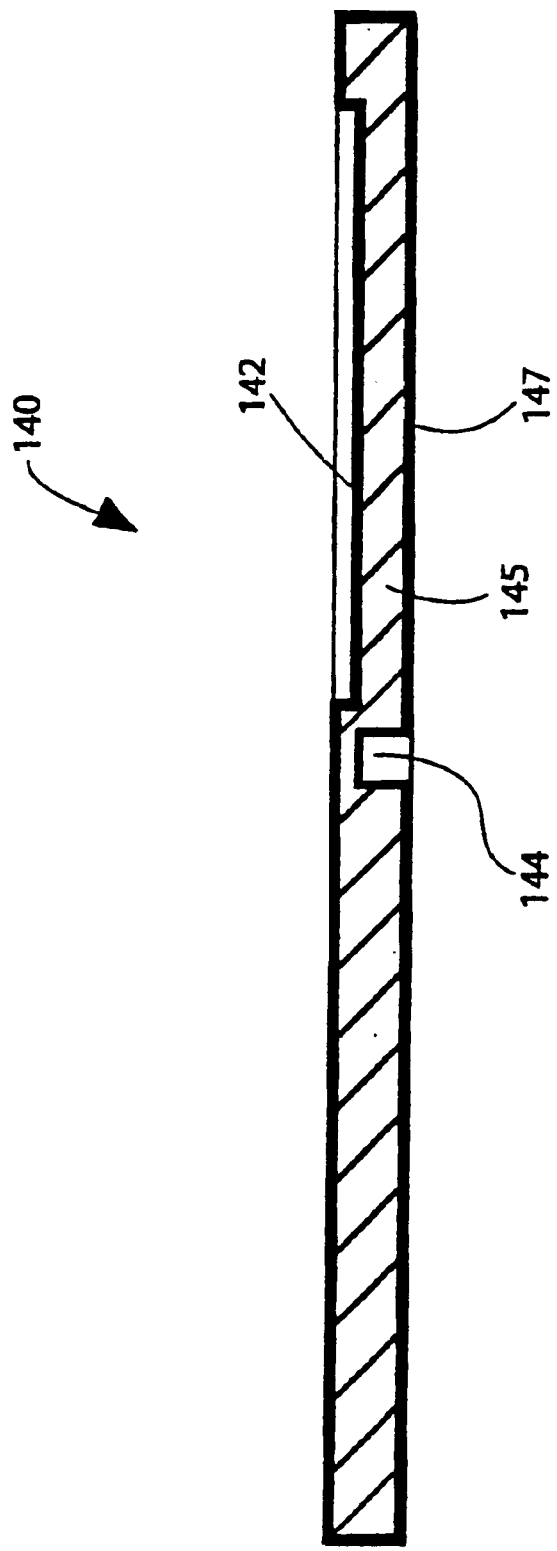
FIG. 17 is a cross-sectional view of a platter forming a part of the housing assembly of FIG. 1 taken along the line 17—17 of FIG. 1.

With reference to FIG. 17, the platter 140 includes a plurality of recesses on the upper side thereof adapted to hold the wafers 5. A pin recess 144 for receiving the pin 149 is formed in the lower side of the platter 140. The platter 140 includes a core 145 and a surrounding layer or coating 147. Preferably, the coating 147 completely surrounds the core 145. The core 145 may be formed of the same materials as discussed above with regard to the side wall susceptors 130. The coating 147 may be formed of the same materials and dimensions as discussed above with regard to the coating 137, with the same material(s) and dimensions being preferred, and may be applied to the core 145 in the manner described above. Alternatively, the platter 140 may be formed of solid SiC or a solid SiC alloy.

The insulation covers 16, 18 may be formed of any suitable material to thermally insulate the housing assembly 100. Preferably, the insulation covers 16, 18 are formed of a material having high purity, low chemical reactivity and a thermal conductivity of less than about 2 W/m/K in vacuum.

Suitable EMF generators for the EMF generator 11 include a BIG available from Huettinger Electronic of Germany. The coil 14 and the power supply 12 are electrically coupled such that the power supply 12 may provide an A/C current through the coil 14 at a selected frequency or range of frequencies. Preferably, the power supply 12 is operable to provide a current through the coil 14 at frequencies of between at least 5 kHz and 1 MHz or a subset of frequencies in this range. Preferably, the power supply 12 is operable to provide power in a range of at least 20 kW to 150 kW.

The housing assembly 100 may be assembled as follows. The side susceptor members 130 are mounted on the bottom susceptor member 110. The rear liner member 152 is placed on the bottom susceptor member 110 such that the tab 110A is received in the slot 152B and the ridge 114 is received in the recess 152C. In this manner, the liner member 152 is positively located and secured in place on the bottom susceptor member 110. The front liner member 154 is placed on the bottom susceptor member 110 such that the ridge 114 is received in the recess 154C. Prior to or following placement of either or both of the liner members 152, 154, the platter 140 is placed on the pin 149 over the platter region 112 and in the opening 156. The top liner 160 and the top susceptor member 120 are mounted on the side susceptor members 130.

In use, one or more of the substrates 5 are placed in the passage 102 on the platter 140. The power supply 12 is operated to provide a power level and frequency of alternating current through the coil in a known manner to generate an electromagnetic field. The current frequency is selected such that eddy currents are generated in the susceptor members 110, 120, 130. The electrical resistances of the cores 115, 125, 135 and the coatings 117, 127, 137 convert at least portions of the eddy currents to heat such that heat is generated in the susceptor members 110, 120, 130. However, the current frequency is selected such that substantially no eddy currents are generated in the liners 150, 160 or the platter 140. Rather, substantially all of the power from the coil 14 absorbed by the housing assembly 100 is attenuated by the susceptor members 110, 120, 130. Preferably, at least 90% of the power is attenuated by the susceptor members 110, 120, 130, more preferably at least 95%, and most preferably 100%. Accordingly, no or only insubstantial heat is inductively generated in the liners 150, 160 or the platter 140.

The heat or thermal energy inductively generated in the susceptor members 110, 120, 130 is thermally conducted from the susceptor members 110, 120, 130 through the liners 150, 160 and the platter 140 to the passage 102. The substrate 5 is thereby heated by conduction (through the platter 140), radiation and convection. Preferably, the substrate 5 is heated to a temperature of between about 1400 and 1800° C. Notably, and preferably, the platter 140 directly overlies the platter region 112 of the bottom susceptor member 110 without a portion of the liner 150 being interposed therebetween. The coatings 157, 167 on the liners 150, 160 may provide thermal breaks from the susceptor members 110, 120 to further promote thermal uniformity.

In this manner, the internal surfaces of the housing assembly 100 (i.e., the surfaces in fluid communication with the passage 102) are maintained at a more spatially uniform temperature so that the thermal gradients in the vicinity of the substrate are reduced. Restated, a more isothermal environment may be created in the passage 102 for the substrate 5 such that the temperature of the portion of the housing assembly 100 in contact with the substrate 5 (i.e., the platter 140) is at substantially the same temperature as the other surfaces defining the passage 102 (i.e., the interior surfaces of the liners 150, 160 and the side susceptor members 130). The substrate 5 may therefore itself be substantially the same temperature as the surfaces defining the passage 102. As a result, the aforementioned problems associated with undesirably large thermal gradients may be reduced. For example, the formation of loose deposits may be eliminated or reduced. The process (e.g., an epitaxy process) may be more accurately controlled.

During the reacting process, the processing gas IG (FIG. 2) may be flowed into the passage 102 through the opening 104. The processing gas IG may include precursor gases such as silane ($SiH_4$) and propane ($C_3H_8$) introduced with and transported by a carrier of purified hydrogen gas ($H_2$). The processing gas IG passes through the passage 102. As the processing gas IG passes through the hot zone generated by the EMF generator 11, SiC deposition reactions take place on the substrate 5. The remainder OG of the processing gas exits the passage 102 through the opening 106. Preferably, the processing gas IG is flowed through the passage 102 at a rate of at least 10 slpm.

It may be desirable to remove and replace the platter 140. For example, it may be necessary to remove the substrate or substrates 5 following processing and replace them with new substrates for processing. Also, it may be desirable to remove the platter 140 for cleaning or replacement with a new platter. The platter may be conveniently removed by first removing the front liner member 154 and then removing the platter 140. It may also be desirable to remove either or both of the liner members 152, 154. Each of these procedures may be executed without disassembling the remainder of the housing assembly 100 or removing the housing assembly 100 from the reactor assembly 10.

The housing assembly 100 may provide for a more efficient, convenient and durable heating device, particularly where TaC is used for the coatings 117, 127 and SiC is used for the coatings 130, 140, 150, 160. The TaC coatings 117, 127, 137 may serve to reduce thermal radiation losses and prevent or reduce undesirable sublimation of the SiC coatings. The TaC coating in the platter region 112 of the bottom susceptor 110 may provide a more durable platform for the rotating platter 140. The provision of the SiC coatings in fluid communication with the passage 102 and in the vicinity of the substrate take advantage of the adherent nature of parasitic SiC deposits to the SiC coatings and the chemical, thermal, mechanical, and structural similarity of the SiC coatings and the SiC substrate 5. The SiC coatings 137 on the side susceptor members 130 may assist in reducing the heating of the side susceptors due to induction heating.

The provision of liners 150, 160 separately formed from the susceptor members 110, 120, 130 may allow for extension of the service life of the housing assembly 100 as well as reductions in cost of use and downtime. The liners 150, 160 may be cost-effectively replaced when they reach the end of their useful service lives without requiring replacement of the remainder of the housing assembly 100. Moreover, the liner members 152, 154 can be removed for cleaning (e.g., to scrape away parasitic deposits) without requiring removal of the housing assembly from the reactor assembly 10 or disassembly of the remainder of the housing assembly 100.

The design (e.g., dimensions, materials, and/or placement) of the liner or liners may be selected, modified or interchanged to shape or control the temperature gradient in the processing chamber. For example, additional liners may be positioned along the side susceptor members 130 or one or more of the liners may vary in thickness or material. The liners may be integrated (e.g., as a unitary sleeve). The liners may be integrally formed with the susceptor member or members. Preferably, the liner or liners will include an opening corresponding to the opening 156 positioned to receive the platter.

Liners may be selected or interchanged to obtain desired gas flow characteristics. In particular, the top liner 160 may be removed and replaced with a top liner having a differently shaped wedge portion 162 or having no wedge portion.

While certain embodiments have been described above, it will be appreciated that various modifications may be made in accordance with the invention. For example, the processing chamber may be closed at one or both ends rather than providing a through passage 102. Housing assemblies and heating devices according to the invention may be used for other types of processes and material systems, as well as in other types of deposition systems. In particular, the housing assemblies and heating devices according to the invention may be used for annealing processes. Articles other than semiconductor substrates may be processed.

In other embodiments, end insulation may be placed at either or both ends of the housing assembly 100. The end insulation, if present, may be shaped like a short cylinder of diameter to match the diameter of the covers 16, 18. Passages through the end insulation may be provided to permit the process gas IG to flow freely through the processing chamber. The passages in the end insulations may be provided with protection liners, preferably made of silicon carbide coated graphite, that separate the process gas IG from the end insulation material which may contaminate the process gas.

While preferred embodiments have been described with reference to "top", "bottom" and the like, other orientations and configurations may be employed in accordance with the invention.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A heating device for controllably heating an article, the heating device defining a processing chamber to hold the article and comprising:

a) a housing including:

a susceptor portion surrounding at least a portion of the processing chamber; and a conductor portion interposed between the susceptor portion and the processing chamber; and b) an EMF generator configured to generate an electromagnetic field to induce eddy currents within the susceptor portion such that substantially none of the electromagnetic field is applied to the conductor portion and substantially no eddy currents are induced in the conductor portion;

c) wherein the conductor portion is operative to conduct heat from the susceptor portion to the processing chamber; and d) wherein eddy currents induced by the EMF generator are present in the susceptor portion and substantially no eddy currents are present in the conductor portion.

2. The heating device of claim 1 wherein the susceptor portion includes a susceptor core of a first material and a susceptor coating of a second material.

3. The heating device of claim 2 wherein the first material is graphite.

4. The heating device of claim 2 wherein the second material is SiC.

5. The heating device of claim 2 wherein the second material is selected from the group consisting of refractory metal carbides.

6. The heating device of claim 5 wherein the second material is TaC.

7. The heating device of claim 1 wherein substantially all surfaces of the conductor portion in fluid communication with the processing chamber are formed of SiC.

8. The heating device of claim 7 wherein the conductor portion includes a conductor core of a first material and a conductor coating of a second material different from the first material.

9. The heating device of claim 8 wherein the first material is graphite.

10. The heating device of claim 8 wherein the second material is a refractory metal carbide.

11. The heating device of claim 8 wherein the second material is SiC.

12. The heating device of claim 1 wherein:

a) the susceptor portion includes a first susceptor portion and a second susceptor portion disposed on opposed sides of the processing chamber; and b) the conductor portion includes a first liner disposed between the first susceptor portion and the processing chamber and a second liner disposed between the second susceptor portion and the processing chamber.

13. The heating device of claim 12 wherein the second susceptor portion includes a platter region, the heating device further including:

a platter adapted to support the article disposed in the processing chamber and overlying the platter region; and an opening defined in the second liner and overlying the platter region and interposed between the platter region and the platter.

14. The heating device of claim 1 including a platter adapted to support the article disposed in the processing chamber.

15. The heating device of claim 14 wherein the EMF generator is configured to generate the electromagnetic field such that:

there are no substantial eddy currents induced in the platter by the electromagnetic field; and the platter conducts heat from the susceptor portion to the processing chamber.

16. The heating device of claim 14 including an opening defined in the conductor portion, wherein the opening is interposed between the susceptor portion and the platter.

17. The heating device of claim 14 wherein the platter is adapted to rotate relative to the susceptor portion.

18. The heating device of claim 1 including an inlet opening and an outlet opening in fluid communication with the processing chamber.

19. The heating device of claim 18 including a supply of processing gas reactive to heat to deposit SiC.

20. The heating device of claim 1 wherein the EMF generator is operable to heat the susceptor portion to a temperature of at least 1400° C.

21. The heating device of claim 1 wherein the conductor portion is separately formed from the susceptor portion and is removable from the susceptor portion without requiring disassembly of the susceptor portion.

22. The heating device of claim 21 including means for positively and removably locating the conductor portion relative to the susceptor portion.

23. The heating device of claim 1 wherein the conductor portion is separately formed from the susceptor portion and varies in thickness along at least a portion of its length.

24. A heating device for controllably heating an article, the heating device defining a processing chamber to hold the article and comprising:

a) a housing including:

a susceptor portion surrounding at least a portion of the processing chamber; and a conductor portion interposed between the susceptor portion and the processing chamber; and b) an EMF generator configured to induce eddy currents within the susceptor portion such that substantially no eddy currents are induced in the conductor portion;

c) wherein the conductor portion is operative to conduct heat from the susceptor portion to the processing chamber;

d) wherein eddy currents induced by the EMF generator are present in the susceptor portion and substantially no eddy currents are present in the conductor portion;

e) wherein:

the susceptor portion includes a first susceptor portion and a second susceptor portion disposed on opposed sides of the processing chamber; and the conductor portion includes a first liner disposed between the first susceptor portion and the processing chamber and a second liner disposed between the second susceptor portion and the processing chamber;

f) wherein the second susceptor portion includes a platter region, the heating device further including:

a platter adapted to support the article disposed in the processing chamber and overlying the platter region; and an opening defined in the second liner and overlying the platter region and interposed between the platter region and the platter; and g) wherein the second liner includes first and second liner members disposed on opposed sides of the platter and each defining a portion of the opening, wherein the first and second liner members are separable.

25. The heating device of claim 24 wherein at least one of the first and second liner members is separable from the second susceptor portion.

26. A housing assembly for an induction heating device, the housing assembly defining a processing chamber and comprising:

a) a susceptor surrounding at least a portion of the processing chamber; and b) a thermally conductive liner interposed between the susceptor and the processing chamber, wherein the liner is separately formed from the susceptor;

c) wherein the susceptor includes a platter region, the housing assembly further including:

a platter adapted to support the article disposed in the processing chamber and overlying the platter region: and an opening defined in the liner and interposed between the platter region and the platter; and d) wherein the liner includes first and second liner members disposed on opposed sides of the platter and each defining a portion of the opening, wherein the first and second liner members are separable.

27. The housing assembly of claim 26 wherein at least one of the first and second liner members is separable from the susceptor.

28. A heating device for controllably heating an article, the heating device comprising:

a) a housing assembly defining a processing chamber to hold the article and comprising:

a susceptor surrounding at least a portion of the processing chamber; and a thermally conductive liner interposed between the susceptor and the processing chamber, wherein the liner is separately formed from the susceptor;

wherein the susceptor includes a platter region, the housing assembly further including:

a platter adapted to support the article disposed in the processing chamber and overlying the platter region; and an opening defined in the liner and interposed between the platter region and the platter; and wherein the liner includes first and second liner members disposed on opposed sides of the platter and each defining a portion of the opening, wherein the first and second liner members are separable;

b) an EMF generator configured to induce eddy currents within the susceptor such that substantially no eddy currents are induced in the liner;

c) wherein the liner is operative to conduct heat from the susceptor to the processing chamber; and d) wherein eddy currents induced by the EMF generator are present in the susceptor and substantially no eddy currents are present in the liner.

29. The heating device of claim 28 wherein at least one of the first and second liner members is separable from the susceptor.

* * * * *